United States Patent [19]

Kobatake

[11] Patent Number: 4,847,808

[45] Date of Patent: Jul. 11, 1989

[54] READ ONLY SEMICONDUCTOR MEMORY HAVING MULTIPLE BIT CELLS

[75] Inventor: Hiroyuki Kobatake, Tokyo, Japan

[73] Assignee: NEC Corporation, Tokyo, Japan

[21] Appl. No.: 41,033

[22] Filed: Apr. 22, 1987

[30] Foreign Application Priority Data

Apr. 22, 1986 [JP] Japan ................... 61-93152

[51] Int. Cl.$^4$ ............................. G11C 17/00
[52] U.S. Cl. ................... 364/104; 365/168; 365/184; 357/23.12
[58] Field of Search ............... 365/94, 103, 104, 182, 365/184, 168; 357/23.5, 23.12

[56] References Cited

U.S. PATENT DOCUMENTS

| | | | |
|---|---|---|---|
| 4,272,830 | 6/1981 | Moench | 365/104 |
| 4,503,518 | 3/1985 | Iwahashi | 365/104 |
| 4,596,453 | 10/1985 | Noufer | 365/104 |

OTHER PUBLICATIONS

Bayliss et al, "The Interface Processor for the 32b Computer", IEEE International Solid State Circuits Conference, Digest of Technical Papers, Feb. 1981, pp. 116–117.

*Primary Examiner*—James W. Moffitt
*Assistant Examiner*—Glenn A. Gossage
*Attorney, Agent, or Firm*—Sughrue, Mion, Zinn, Macpeak, and Seas

[57] ABSTRACT

For precise read-out operation at an improved speed, there is disclosed a semiconductor memory device fabricated on a semiconductor substrate of a first conductivity type and including a plurality of memory cells, each memory cell comprising (a) an insulating film covering a surface portion of the semiconductor substrate, (b) a gate electrode formed on the insulating film and located over a channel forming region in the surface portion of the semiconductor substrate, a channel being produced in the channel forming region when the memory cell is selected, (c) a first impurity region having a second conductivity type opposite to the first conductivity type and formed in the surface portion of the semiconductor substrate, the first impurity region being contiguous to the channel forming region or spaced apart from the channel forming region depending upon a bit of information stored therein, and (d) a second impurity region of the second conductivity type formed in the surface portion of the semiconductor substrate, the second impurity region being contiguous to the channel forming region or spaced apart from the channel forming region depending upon a bit of information stored therein.

7 Claims, 5 Drawing Sheets

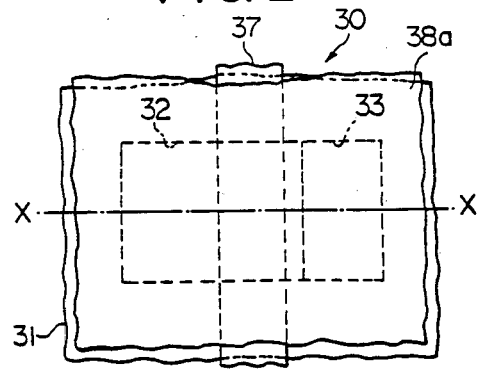
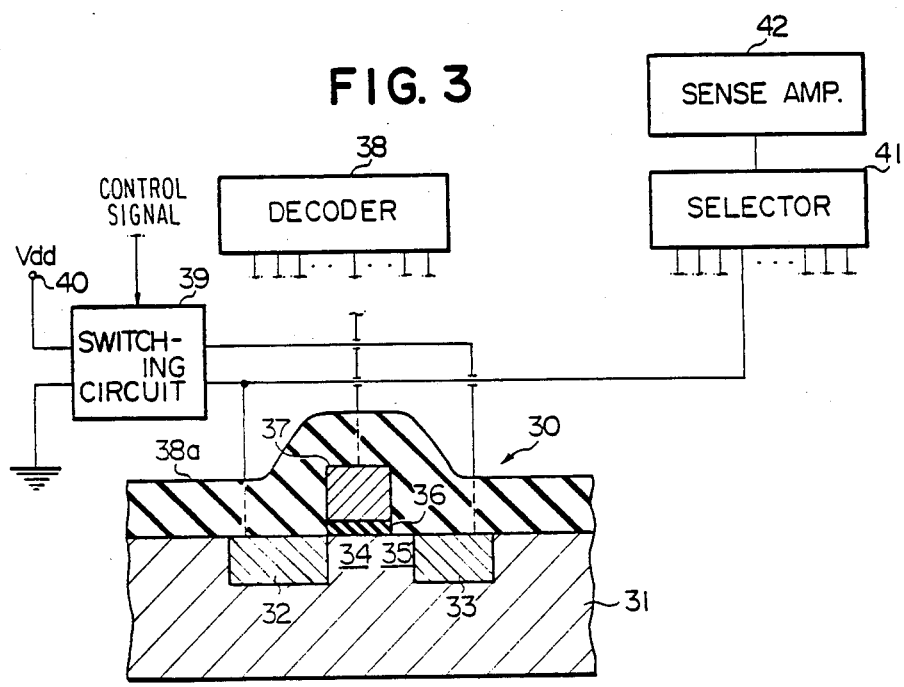

READ ONLY SEMICONDUCTOR MEMORY HAVING MULTIPLE BIT CELLS

FIELD OF THE INVENTION

This invention relates to a semiconductor memory device and, more particularly, to a read-only memory cell structure capable of storing two bits of information.

BACKGROUND OF THE INVENTION

A read-only memory device is fabricated on a semiconductor substrate in association with another semiconductor device, such as a data processing unit and an I/O unit, or separately from these units for storing coded instructions or fixed data. For semiconductor manufacturers, it is still an important object to minimize the occupation area of the read-only memory device, and attempts have therefore been made to save the occupation area for the complete read-only memory device.

One of the attempts is disclosed by John A. Bayliss et al in "The Interface Processor for the 32b Computer", the digest of technical papers of 1981 IEEE International Solid-State Circuits Conference, pages 116 to 117. The interface processor proposed by John A. Bayliss et al has the read-only memory array consisting of a plurality of memory cells each having a two-bits per cell structure. The memory cell structure comprises two n-type impurity regions formed in a surface portion of a p-type semiconductor substrate covered with an insulating layer and a gate electrode formed on the insulating film and located over a channel forming region between the two n-type impurity regions. The channel forming region has a preselected width depending upon a combination of two bits of information stored therein.

Namely, when a memory cell stores two logic "0" bits, the two n-type impurity regions 1 and 2 are spaced apart from the channel forming region 3 located under the gate electrode 4 as will be seen from FIG. 1 (A), then no current flows between the n-type impurity regions 1 and 2 even if a certain positive voltage level is applied to the gate electrode 4. When a memory cell stores an information consisting of the logic "0" bit and the logic "1" bit, the n-type impurity regions 5 and 6 are connected to the channel forming region 7 through n-type lug portions 8 and 9 which are merged into the channel forming region 7, respectively, as shown in FIG. 1 (B), then a small amount of current flows between the n-type impurity regions 5 and 6 through the lug portions 8 and 9 and the channel induced in the channel forming region 7 by the agency of the certain positive voltage level applied to the gate electrode 10. In FIG. 1 (C) is illustrated another memory cell configuration storing an information consisting of the logic "1" bit and the logic "0" bit. The memory cell illustrated in FIG. 1 (C) has lug portions 11 and 12 wider than the lug portions 8 and 9. As the amount of current is in proportion to the width of the lug portions, a substantial amount of current flows between the n-type impurity regions 13 and 14 through the lug portions 11 and 12 and the channel induced in the channel forming regions 15 by the agency of the certain positive voltage level applied to the gate electrode 16. However, if a memory cell is arranged to store two logic "1" bits of information, the memory cell is provided with lug portions 17 and 18 wider than the lug portions 11 and 12 as shown in FIG. 1 (D). Then, a current greater than the current flowing through the memory cell illustrated in FIG. 1 (C) flows between the n-type impurity regions 19 and 20 when the certain positive voltage level is applied to the gate electrode 21. Thus, the memory cells proposed by John A. Bayliss et al allow currents different in amount from one another to flow therethrough depending upon the bits of information stored therein, so that the stored information can be readable by measuring the voltage level at the impurity region.

The memory cell structure proposed by John A. Bayliss et al has achieved substantial reduction in total occupation area; however, problems have been encountered in the memory cell structure proposed by John A. Bayliss et al in complexity in circuit configuration for detecting a small amount of difference in voltage level between the memory cells storing the different informations, respectively. This complexity results in unstable circuit behavior and limitation to high-speed performance.

It is therefore an important object of the present invention to provide a semiconductor memory device having a memory cell structure capable of storing two bits of information which are read out based on the existence or nonexistence of the current.

It is another important object of the invention to provide a semiconductor memory device having a memory cell structure from which a stored information is read out at an improved speed.

SUMMARY OF THE INVENTION

In accordance with one aspect of the present invention, there is provided a semiconductor memory device fabricated on a semiconductor substrate of a first conductivity type and including a plurality of memory cells, each memory cell comprising (a) an insulating film covering a surface portion of the semiconductor substrate, (b) a gate electrode formed on the insulating film and located over a channel forming region in the surface portion of the semiconductor substrate, a channel being produced in the channel forming region when the memory cell is selected, (c) a first impurity region having a second conductivity type opposite to the first conductivity type and formed in the surface portion of the semiconductor substrate, the first impurity region being contiguous to the channel forming region or spaced apart from the channel forming region depending upon a bit of information stored therein, and (d) a second impurity region of the second conductivity type formed in the surface portion of the semiconductor substrate, the second impurity region being contiguous to the channel forming region or spaced apart from the channel forming region depending upon a bit of information stored therein.

In accordance with another aspect of the present invention, there is provided a semiconductor memory device fabricated on a p-type semiconductor substrate having a surface portion covered with an insulating film and including a plurality of memory cells each activated in first and second active modes and storing an information consisting of two logic "1" bits, an information consisting of two logic "0" bits, an information consisting of the logic "0" bit and the logic "1" bit or an information consisting of the logic "1" bit and the logic "0" bit, each memory cell storing the information consisting of the two logic "1" bits comprising (a) a first gate electrode formed on the insulating film and located over a first channel forming region in the surface portion of the semiconductor substrate, a first channel being produced in the first channel forming region when a certain positive voltage level is applied to the first gate electrode in the first and second active modes, (b) a first n-type impurity region formed in the surface portion of the semiconductor substrate and contiguous to the first channel forming region, the first n-type impurity region being supplied with the certain positive voltage level in said first active mode and conducted to the ground in the second active mode, and (c) a second n-type impurity region formed in the surface portion of the semiconductor substrate and contiguous to the first channel forming region, the second n-type impurity region being conducted to the ground in the first active mode and supplied with the certain positive voltage level in the second active mode, each memory cell storing the information consisting of the logic "0" bits comprising (d) a second gate electrode formed on the insulating film and located over a second channel forming region in the surface portion of the semiconductor substrate, a second channel being produced in the second channel forming region when the certain positive voltage level is applied to the second gate electrode in the first and second active modes, (e) a third n-type impurity region formed in the surface portion of the semiconductor substrate and spaced apart from the second channel forming region by a first preselected distance, the third n-type impurity region being supplied with the certain positive voltage level in the first active mode and conducted to the ground in the second active mode, the first preselected distance being determined in such a manner that a depletion layer extending from the third n-type impurity region merges into the second channel in the first active mode, (f) a fourth n-type impurity region formed in the surface portion of the semiconductor substrate and spaced apart from the second channel forming region by a second preselected distance, the fourth n-type impurity region being conducted to the ground in the first active mode and supplied with the certain positive voltage level in the second active mode, the second preselected distance being determined in such a manner that a depletion layer extending from the fourth n-type impurity region merges into the second channel in the second active mode, each memory cell storing the information consisting of the logic "0" bit and the logic "1" bit comprising (g) a third gate electrode formed on the insulating film and located over a third channel forming region in the surface portion of the semiconductor substrate, a third channel being produced in the third channel forming region when the certain positive voltage level is applied to the third gate electrode in the first and second active modes, (h) a fifth n-type impurity region formed in the surface portion of the semiconductor substrate and contiguous to the third channel forming region, the fifth n-type impurity region being supplied with the certain positive voltage level in the first active mode and conducted to the ground in the second active mode, and (i) a sixth n-type impurity region formed in the surface portion of the semiconductor substrate and spaced apart from the third channel forming region by a third preselected distance, the sixth n-type impurity region being conducted to the ground in the first active mode and supplied with the certain positive voltage level in the second active mode, the third preselected distance being determined in such a manner that a depletion layer extending from the sixth n-type impurity region merges into the third channel in the second active mode, each memory cell storing the information consisting of the logic "1" bit and the logic "0" bit comprising (j) a fourth gate electrode formed on the insulating film and located over a fourth channel forming region in the surface portion of the semiconductor substrate, a fourth channel being produced in the fourth channel forming region when the certain positive voltage level is applied to the fourth gate electrode in the first and second active modes, (k) a seventh n-type impurity region formed in the surface portion of the semiconductor substrate and spaced apart from the fourth channel forming region by a fourth preselected distance, the seventh n-type impurity region being supplied with the certain positive voltage level in the first active mode and conducted to the ground in the second active mode, the fourth preselected distance being determined in such a manner that a depletion layer extending from the seventh n-type impurity region merges into the fourth channel in the first active mode, and (l) an eighth n-type impurity region formed in the surface portion of the semiconductor substrate and contiguous to the fourth channel forming region, the eighth n-type impurity region being conducted to the ground in the first active mode and supplied with the certain positive voltage level in the second active mode.

BRIEF DESCRIPTION OF THE DRAWINGS

The features and advantages of a semiconductor memory device according to the present invention will be more clearly understood from the following description taken in conjunction with the accompanying drawings in which:

FIG. 2 is a plan view showing the memory cell configuration incorporated in a semiconductor memory device embodying the present invention;

FIG. 3 is a view taken along the line X—X of FIG. 2 and showing the memory cell structure together with related circuits.

DESCRIPTION OF THE PREFERRED EMBODIMENT

Figure 1:
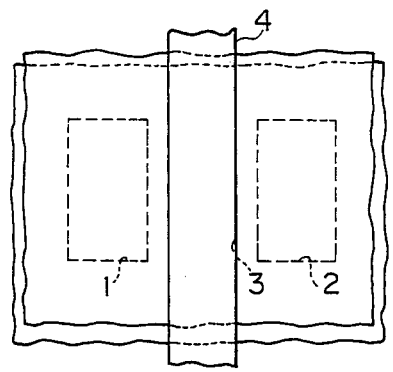
FIGS. 1 (A) to 1 (D) are plan views showing the memory cell configurations incorporated in a prior-art semiconductor device.
Figure 1:
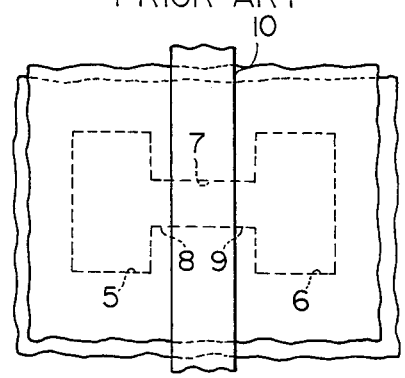
Figure 1C:
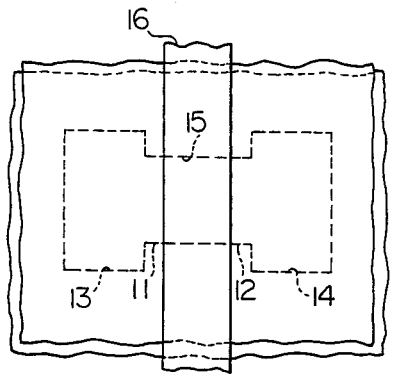
Figure 1D:
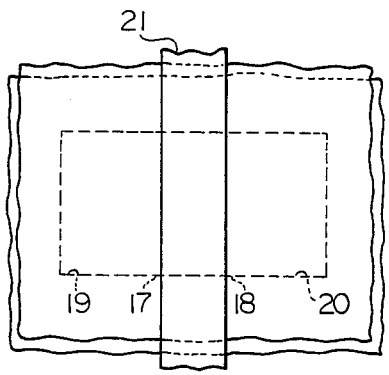

Referring to FIGS. 2 and 3 of the drawings, there is shown a read-only memory cell 30 incorporated in a semiconductor memory device according to the present invention. The read-only memory cell 30 is fabricated on a p-type semiconductor substrate 31 of, for example, silicon having a surface portion. In the surface portion of the semiconductor substrate 31 is formed n-type impurity regions 32 and 33 spaced apart from each other by a channel forming portion 34 and a gap portion 35. In this instance, the n-type impurity region 32 is contiguous to the channel forming portion 34, and the gap portion 35 intervenes between the channel forming portion 34 and the n-type impurity region 33; however, the semiconductor memory device has the other 3 types of read-only memory cells with different configurations which will be described hereinunder.

The channel forming portion 34 is covered with a thin gate insulating film 36 of, for example, silicon dioxide, and a gate electrode 37 of, for example, polysilicon is formed and patterned on the gate insulating film 36. The resultant structure is covered with a thick insulating layer 38a.

The gate electrode 37 is connected to a decoder circuit 38 which supplies the gate electrode 37 with a certain positive voltage level Vdd when the memory cell 30 is selected. When the gate electrode 37 is supplied with the certain positive voltage level Vdd, a channel is induced in the channel forming portion 34 by the agency of the certain positive voltage level Vdd applied to the gate electrode. The n-type impurity regions 32 and 33 are connected to a switching circuit 39 which is responsive to a control signal representing either a first active mode or a second active mode and operative to couple the n-type impurity regions 32 and 33 with a positive voltage source 40 producing the certain positive voltage level Vdd and the ground, respectively, or vice versa. Namely, the n-type impurity regions 32 and 33 thus arranged are supplied with the certain positive voltage level Vdd and the ground level, respectively, in the presence of the control signal representing the first active mode and, on the other hand, are supplied with the ground level and the certain positive voltage level, respectively, in the presence of the control signal representing the second active mode. As the n-type impurity region 33 is supplied with the certain positive voltage level Vdd in the second active mode, a depletion layer is produced and extends into the semiconductor substrate 31. The amount of penetration can be calculated from the impurity concentration and the difference in voltage between the semiconductor substrate 31 and the n-type impurity region 33, so that the gap portion 35 is adjusted to have a length selected in such a manner that the depletion layer extending from the n-type impurity region 33 merges into the channel induced in the channel forming portion by the agency of the certain positive voltage level Vdd applied to the gate electrode 37 and the n-type impurity region 33.

The n-type impurity region 32 is further connected to a selector 41 which is operative to transfer the voltage level at the impurity region 32 to a sense amplifier 42 in order to determine the logic level based thereon when the read-only memory cell 30 is selected.

In operation, when the memory cell 30 is accessed, the decoder circuit 38 supplies the gate electrode 37 with the certain positive voltage level Vdd, and the switching circuit 39 responds to the control signal representing the first active mode to make the n-type impurity regions 32 and 33 be coupled with the positive voltage source 40 and the ground, respectively. In this situation, no current flows from the n-type impurity region 32 to the n-type impurity region 33 because no depletion layer takes place from the n-type impurity region 33 supplied with the ground level, causing the gap portion 35 to electrically separate the n-type impurity region 33 from the channel induced in the channel forming portion 34. Then, the n-type impurity region 32 has a voltage level approximately equal to the certain positive voltage level Vdd. The selector 41 transfers the voltage level at the impurity region 32 to the sense amplifier 42. As a result of amplification by the sense amplifier 42, one of the two bits of information stored therein is detected to be a logic "0" level.

Subsequently, the switching circuit 39 couples the n-type impurity regions 32 and 33 with the ground and the positive voltage source 40, respectively, in response to the control signal representing the second active mode. Then, the n-type impurity region 33 is supplied with the certain positive voltage level Vdd, and a depletion layer extends toward the channel induced in the channel forming portion 34. The gap portion 35 is narrow enough to make the depletion layer extending from the n-type impurity region 33 merge into the channel in the channel forming portion 34, so that a current path is established between the n-type impurity regions 32 and 33, allowing the current to flow from the n-type impurity region 32 through the n-type impurity region 33 and the switching circuit 39 to the ground. This results in a voltage level approximately equal to the ground level at the n-type impurity region 32. The voltage level at the impurity region 32 is transferred to the selector 41 which in turn transfers the voltage level to the sense amplifier 42. Then, the sense amplifier 42 determines the other bit of information stored therein to be a logic "1". Consequently, the stored information consisting of the logic "0" and the logic "1" is read out from the read-only memory cell 30.

In the semiconductor memory device illustrated in FIG. 3, the sense amplifier 42 determines the logic level based on the voltage level at the n-type impurity region 32 approximately equal to the certain positive voltage level Vdd or the ground level. The sense amplifier 42 thus supplied with the large difference in voltage level is able to operate at an improved speed to determine the logic levels of the stored bits without error.

Figure 4:
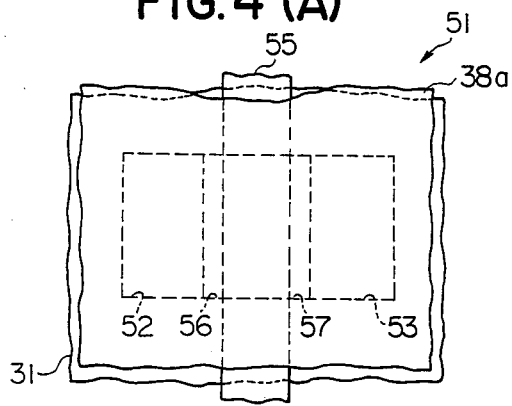
FIGS. 4 (A) to 4 (D) are plan views showing four memory cell configurations of the semiconductor memory device for storing different informations, respectively.
Figure 4:
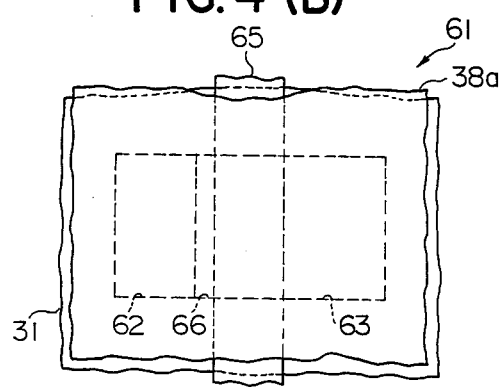
Figure 4C:
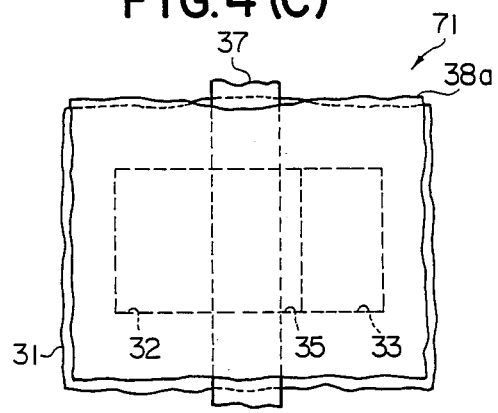
Figure 4D:
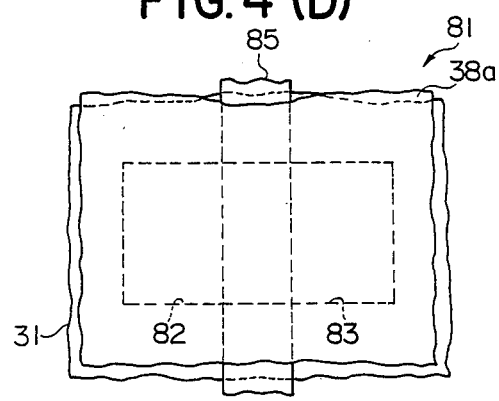

Turning to FIGS. 4 (A) to 4 (D), the four types of read-only memory cells incorporated in the semiconductor memory device according to the present invention are illustrated. The read-only memory cells are different in configuration from one another in order to store four different informations each consisting of two bits.

Namely, a read-only memory cell 51 illustrated in FIG. 4 (A) has two n-type impurity regions 52 and 53 formed in the surface portion of the p-type semiconductor substrate 31 and a gate electrode 55 formed on a thin insulating film covering the surface portion and located over a channel forming portion where a channel is induced when the certain positive voltage level is applied to the gate electrode 55. However, both of the n-type impurity regions 52 and 53 are spaced apart from the channel forming region by gap portions 56 and 57, respectively, each of which has the preselected length equal to that of the gap portion 35 described hereinbefore. The read-only memory cell 51 thus arranged can store two bits of information each consisting of the logic "0". In other words, no current path takes place between the n-type impurity regions 52 and 53 in the presence of the control signals representing the first and second active modes, respectively.

In FIG. 4 (B) of the drawings is illustrated another read-only memory cell having two impurity regions 62 and 63 formed in the surface portion of the semiconductor substrate 31 and a gate electrode 65 formed on a thin insulating film covering the surface portion and located over a channel forming portion where a channel is induced when the certain positive voltage level is applied to the gate electrode 65. The n-type impurity region 62 is spaced apart from the channel forming portion by a gap portion 66 which has the length equal to that of the gap portion 35, however the n-type impurity region 63 is contiguous to the channel forming portion. Then, the read-only memory cell is capable of storing two bits of information consisting of the logic "1" and the logic "0", because a current path takes place between the n-type impurity regions 62 and 63 in the first active mode but no current path is produced therebetween in the second active mode.

FIG. 4 (C) shows a read-only memory cell similar in configuration to the read-only memory cell 30. Then, regions, portions and gate electrode of a read-only memory cell 71 illustrated in FIG. 4 (C) are denoted by like reference numerals designating the counter parts of the read-only memory cell 30 and detailed description will be omitted for the sake of simplicity. The read-only memory cell 71 has the similar configuration to the read-only memory cell 30 so that the read-only memory cell 71 is capable of storing the two bits of information consisting of the logic "0" and the logic "1".

In FIG. 4 (D) is illustrated still another read-only memory cell 81 having two n-type impurity regions 82 and 83 formed in the surface portion of the semiconductor substrate 31 and a gate electrode 85 formed on a thin insulating film covering the surface portion and located over a channel forming portion where a channel is induced when the certain positive voltage level is applied to the gate electrode 85. The n-type impurity regions 82 and 83 are contiguous to the channel forming region, respectively. Then, the read-only memory cell 81 is capable of storing two bits of information each consisting the logic "1", because a current path takes place between the n-type impurity regions 82 and 83 in the first and second active modes.

As will be understood from the foregoing description, the semiconductor device according to the present invention is advantageous over the prior-art memory unit proposed by John A. Bayliss et al in precise read-out operation at an improved speed.

What is claimed is:

1. A semiconductor memory device fabricated on a semiconductor substrate of a first conductivity type and including a plurality of memory cells, each memory cell storing two bits of information each having one of a first and a second logic level, each memory cell comprising:
   (a) an insulating film covering a surface portion of said semiconductor substrate;
   (b) a gate electrode formed on said insulating film and located over a channel forming region in the surface portion of said semiconductor substrate, a channel being produced in said channel forming region when said memory cell is selected;
   (c) a first impurity region having a second conductivity type opposite to said first conductivity type and formed in the surface portion of said semiconductor substrate, said first impurity region being one of contiguous to said channel forming region and spaced apart from the channel forming region depending upon a bit of information stored therein; and
   (d) a second impurity region of said second conductivity type formed in the surface portion of said semiconductor substrate, said second impurity region being one of contiguous to said channel forming region and spaced apart from the channel forming region depending upon a bit of information stored therein, in which each of said memory cells storing two bits of information each having the second logic level has said first and second impurity region spaced apart from said channel forming region, respectively, by a distance selected in such a manner that a depletion layer extending from each of the first and second impurity regions merges into said channel produced in the channel forming region when said gate electrode and each of the first and second impurity regions are supplied with a certain voltage level.

2. A semiconductor memory device fabricated on a semiconductor substrate of a first conductivity type and including a plurality of memory cells, each memory cell storing two bits of information each having one of a first and second logic level, each memory cell comprising:
   (a) an insulating film covering a surface portion of said semiconductor substrate;
   (b) a gate electrode formed on said insulating film and located over a channel forming region in the surface portion of said semiconductor substrate, a channel being produced in said channel forming region when said memory cell is selected;
   (c) a first impurity region having a second conductivity type opposite to said first conductivity type and formed in the surface portion of said semiconductor substrate, said first impurity region being one of contiguous to said channel forming region and spaced apart from the channel forming region depending upon a bit of information stored therein, and
   (d) a second impurity region of said second conductivity type formed in the surface portion of said semiconductor substrate, said second impurity region being one of contiguous to said channel forming region and spaced apart from the channel forming region depending upon a bit of information stored therein, in which each of said memory cells storing a combination of a bit of said first logic level and a bit of said second logic level has said first impurity region contiguous to said channel forming region and said second impurity region spaced apart from the channel forming region, and in which said second impurity region of each memory cell storing the combination is spaced apart from said channel forming region by a distance selected in such a manner that a depletion layer extending from the second impurity region merges into said channel when said gate electrode and the second impurity region are supplied with a certain voltage level.

3. A semiconductor memory device fabricated on a semiconductor substrate of a first conductivity type and including a plurality of memory cells, each memory cell storing two bits of information each having one of a first and a second logic level, each memory cell comprising:
   (a) an insulating film covering a surface portion of said semiconductor substrate;
   (b) a gate electrode formed on said insulating film and located over a channel forming region in the surface portion of said semiconductor substrate, a channel being produced in said channel forming region when said memory cell is selected;
   (c) a first impurity region having a second conductivity type opposite to said first conductivity type and formed in the surface portion of said semiconductor substrate, said first impurity region being one of contiguous to said channel forming region and spaced apart from the channel forming region depending upon a bit of information stored therein; and (d) a second impurity region of said second conductivity type formed in the surface portion of said semiconductor substrate, said second impurity region being one of contiguous to said channel forming region and spaced apart from the channel forming region depending upon a bit of information stored therein in which each memory cell is activated in first and second active modes, said gate electrode and said first impurity region being supplied with a certain voltage level capable of producing said channel when supplying said second impurity region with the ground level in activation of said memory cell during said first active mode, said gate electrode and said second impurity region being supplied with said certain voltage level when supplying said first impurity region with the ground level in activation of said memory cell during said second active mode.

4. A semiconductor memory device fabricated on a p-type semiconductor substrate having a surface portion covered with an insulating film and including a plurality of memory cells each activated in first and second active modes and storing an information consisting of two logic "1" bits, an information consisting of two logic "0" bits, an information consisting of the logic "0" bit and the logic "1" bit or an information consisting of the logic "1" bit and the logic "0" bit, each memory cell storing the information consisting of said two logic "1" bits comprising (a) a first gate electrode formed on said insulating film and located over a first channel forming region in the surface portion of said semiconductor substrate, a first channel being produced in said first channel forming region when a certain positive voltage level is applied to said first gate electrode in said first and second active modes, (b) a first n-type impurity region formed in the surface portion of said semiconductor substrate and contiguous to said first channel forming region, said first n-type impurity region being supplied with said certain positive voltage level in said first active mode and conducted to the ground in said second active mode, and (c) a second n-type impurity region formed in the surface portion of said semiconductor substrate and contiguous to said first channel forming region, said second n-type impurity region being conducted to the ground in said first active mode and supplied with said certain positive voltage level in said second active mode, each memory cell storing the information consisting of said two logic "0" bits comprising (d) a second gate electrode formed on said insulating film and located over a second channel forming region in the surface portion of said semiconductor substrate, a second channel being produced in said second channel forming region when said certain positive voltage level is applied to said second gate electrode in said first and second active modes, (e) a third n-type impurity region formed in the surface portion of said semiconductor substrate and spaced apart from said second channel forming region by a first preselected distance, said third n-type impurity region being supplied with said certain positive voltage level in said first active mode and conducted to the ground in said second active mode, said first preselected distance being determined in such a manner that a depletion layer extending from said third n-type impurity region merges into said second channel in said first active mode, and (f) a fourth n-type impurity region formed in the surface portion of said semiconductor substrate and spaced apart from said second channel forming region by a second preselected distance, said fourth n-type impurity region being conducted to the ground in said first active mode and supplied with said certain positive voltage level in said second active mode, said second preselected distance being determined in such a manner that a depletion layer extending from said fourth n-type impurity region merges into said second channel in said second active mode, each memory cell storing the information consisting of said logic "0" bit and said logic "1" bit comprising (g) a third gate electrode formed on said insulating film and located over a third channel forming region in the surface portion of said semiconductor substrate, a third channel being produced in said third channel forming region when said certain positive voltage level is applied to said third gate electrode in said first and second active modes, (h) a fifth n-type impurity region formed in the surface portion of said semiconductor substrate and contiguous to said third channel forming region, said fifth n-type impurity region being supplied with said certain positive voltage level in said first active mode and conducted to the ground in said second active mode, and (i) a sixth n-type impurity region formed in the surface portion of said semiconductor substrate and spaced apart from said third channel forming region by a third preselected distance, said sixth n-type impurity region being conducted to the ground in said first active mode and supplied with said certain positive voltage level in said second active mode, said third preselected distance is determined in such a manner that a depletion layer extending from said sixth n-type impurity region merges into said third channel in said second active mode, each memory cell storing the information consisting of said logic "1" bit and said logic "0" bit comprising (j) a fourth gate electrode formed on said insulating film and located over a fourth channel forming region in the surface portion of said semiconductor substrate, a fourth channel being produced in said fourth channel forming region when said certain positive voltage level is applied to said fourth gate electrode in said first and second active modes, (k) a seventh n-type impurity region formed in the surface portion of said semiconductor substrate and spaced apart from the fourth channel forming region by a fourth preselected distance, said seventh n-type impurity region being supplied with said certain positive voltage level in said first active mode and conducted to the ground in said second active mode, said fourth preselected distance being determined in such a manner that a depletion layer extending from said seventh n-type impurity region merges into said fourth channel in said first active mode, and (l) an eighth n-type impurity region formed in the surface portion of said semiconductor substrate and contiguous to said fourth channel forming region, said eighth n-type impurity region being conducted to the ground in said first active mode and supplied with said certain positive voltage level in said second active mode.

5. A semiconductor memory device fabricated on a semiconductor substrate of a first conductivity type and including a plurality of memory cells, each memory cell storing two bits of information each having one of a first and second logic level, each memory cell comprising:

(a) an insulating film covering a surface portion of said semiconductor substrate;

(b) a gate electrode formed on said insulating film and located over a channel forming region in the surface portion of said semiconductor substrate, a channel being produced in said channel forming region when said memory cell is selected;

(c) a first impurity region having a second conductivity type opposite to said first conductivity type and formed in the surface portion of said semiconductor substrate; and (d) a second impurity region of said second conductivity type formed in the surface portion of said semiconductor substrate, in which each of said memory cells storing two bits of information each having said first logic level has said first and second impurity regions contiguous to said channel forming region, and in which each of said memory cells storing two bits of information each having said second logic level has said first and second impurity regions each spaced apart from said channel forming region by a distance selected in such a manner that a depletion layer extending from each of the first and second impurity regions merges into said channel produced in the channel forming region when said gate electrode and each of the first and second impurity regions are supplied with a certain voltage level.

6. A semiconductor memory device as set forth in claim 5, in which each of said memory cells storing a combination of a bit of said first logic level and a bit of said second logic level has said first impurity region contiguous to said channel forming region and said second impurity region spaced apart from the channel forming region, and in which said second impurity region of each memory cell storing the combination is spaced apart from said channel forming region by a distance selected in such a manner that a depletion layer extending from the second impurity region merges into said channel when said gate electrode and the second impurity region are supplied with the certain voltage level.

7. A semiconductor memory device as set forth in claim 5, in which each memory cell is activated in first and second active modes, said gate electrode and said first impurity region being supplied with a certain voltage level capable of producing said channel when supplying said second impurity region with the ground level in activation of said memory cell during said first active mode, said gate electrode and said second impurity region being supplied with said certain voltage level when supplying said first impurity region with the ground level in activation of said memory cell during said second active mode.

* * * * *